US005387314A

United States Patent [19]

Baughman et al.

[11] Patent Number: 5,387,314

[45] Date of Patent: Feb. 7, 1995

[54] FABRICATION OF INK FILL SLOTS IN THERMAL INK-JET PRINTHEADS UTILIZING CHEMICAL MICROMACHINING

[75] Inventors: Kit C. Baughman; Jeffrey A. Kahn, both of Corvallis; Paul H. McClelland, Monmouth; Kenneth E. Trueba; Ellen R. Tappon, both of Corvallis, all of Oreg.

[73] Assignee: Hewlett-Packard Company, Palo Alto, Calif.

[21] Appl. No.: 9,151

[22] Filed: Jan. 25, 1993

[51] Int. Cl.[6] ....................... H01L 21/306; B44C 1/22; C03C 15/00; B29C 37/00

[52] U.S. Cl. .................................... 156/643; 156/644; 156/647; 156/657; 156/659.1; 156/662

[58] Field of Search ............... 156/643, 644, 645, 647, 156/651, 653, 657, 659.1, 662, 668; 346/140 R

[56] References Cited

U.S. PATENT DOCUMENTS

| | | | |
|---|---|---|---|
| Re. 32,572 | 1/1988 | Hawkins et al. | 156/626 |
| 4,601,777 | 7/1986 | Hawkins et al. | 156/626 |
| 4,612,554 | 9/1986 | Poleshuk | 346/140 R |
| 4,638,337 | 1/1987 | Torpey et al. | 346/140 R |
| 4,789,425 | 12/1988 | Drake et al. | 156/644 |
| 4,829,324 | 5/1989 | Drake et al. | 346/140 R |
| 4,851,371 | 7/1989 | Fisher et al. | 437/226 |
| 4,863,560 | 9/1989 | Hawkins | 156/644 |
| 4,875,968 | 10/1989 | O'Neill et al. | 156/633 |
| 4,882,595 | 11/1989 | Trueba et al. | 346/140 R |
| 4,899,178 | 2/1990 | Tellier | 346/140 R |
| 4,899,181 | 2/1990 | Hawkins et al. | 346/140 R |
| 4,961,821 | 10/1990 | Drake et al. | 156/647 |
| 5,160,577 | 11/1992 | Deshpande | 156/644 |
| 5,308,442 | 5/1994 | Taub et al. | 156/644 |

OTHER PUBLICATIONS

K. E. Bean, "Anisotropic Etching of Silicon", in *IEEE Transactions on Electron Devices*, vol. ED-25, No. 10, pp. 1185-1192 (Oct. 1978).

K. E. Petersen, "Silicon as a Mechanical Material", in *Proceedings of the IEEE*, vol. 70, No. 5, pp. 420-457 (May 1982).

E. Bassous, "Fabrication of Novel Three-Dimensional Microstructures by the Anisotropic Etching of (100) and (110) Silicon", in *IEEE Transactions on Electron Devices*, vol. ED-25, No. 10, pp. 1178-1185 (Oct. 1978).

*Primary Examiner*—William Powell

[57] ABSTRACT

An ink fill slot can be precisely manufactured in a substrate utilizing photolithographic techniques with chemical etching, plasma etching, or a combination thereof. These methods may be used in conjunction with laser ablation, mechanical abrasion, or electromechanical machining to remove additional substrate material in desired areas. The ink fill slots are appropriately configured to provide the requisite volume of ink at increasingly higher frequency of operation of the printhead by means of an extended portion that results in a reduced shelf length and thus reduced fluid impedance imparted to the ink. The extended portion is precisely etched to controllably align it with other elements of the printhead.

18 Claims, 6 Drawing Sheets

FABRICATION OF INK FILL SLOTS IN THERMAL INK-JET PRINTHEADS UTILIZING CHEMICAL MICROMACHINING

CROSS-REFERENCE TO RELATED APPLICATIONS

The present application is related to U.S. Pat. No. 5,317,346, entitled "Compound Ink Feed Slot" and assigned to the same assignee as the present application. The present application is also related to U.S. Pat. No. 5,308,442, entitled "Anisotropically Etched Ink Feed Slot in Silicon" and assigned to the same assignee as the present application.

TECHNICAL FIELD

The present invention relates to thermal ink-jet printers, and, more particularly, to an improved printhead structure for introducing ink into the firing chambers.

BACKGROUND ART

In the art of thermal ink-jet printing, it is known to provide a plurality of electrically resistive elements on a common substrate for the purpose of heating a corresponding plurality of ink volumes contained in adjacent ink reservoirs leading to the ink ejection and printing process. Using such an arrangement, the adjacent ink reservoirs are typically provided as cavities in a barrier layer attached to the substrate for properly isolating mechanical energy to predefined volumes of ink. The mechanical energy results from the conversion of electrical energy supplied to the resistive elements which creates a rapidly expanding vapor bubble in the ink above the resistive elements. Also, a plurality of ink ejection orifices are provided above these cavities in a nozzle plate and provide exit paths for ink during the printing process.

In the operation of thermal ink-jet printheads, it is necessary to provide a flow of ink to the thermal, or resistive, element causing ink drop ejection. This has been accomplished by manufacturing ink fill channels, or slots, in the substrate, ink barrier, or nozzle plate.

Prior methods of forming ink fill slots have involved many time-consuming operations, resulting in variable geometries, requiring precise mechanical alignment of parts, and typically could be performed on single substrates only. These disadvantages make prior methods less desirable than the herein described invention.

Further, at higher frequencies of operation, the prior art methods of forming ink slots provide channels that simply do not have the capacity to adequately respond to ink volume demands.

Fabrication of silicon structures for ink-jet printing are known; see, e.g., U.S. Pat. Nos. 4,863,560, 4,899,181, 4,875,968, 4,612,554, 4,601,777 (and its reissue Re 32,572), 4,899,178, 4,851,371, 4,638,337, and 4,829,324. These patents are all directed to the so-called "side-shooter" ink-jet printhead configuration. However, the fluid dynamical considerations are completely different than for a "top-shooter" (or "roof-shooter") configuration, to which the present invention applies, and consequently, these patents have no bearing on the present invention.

U.S. Pat. No. 4,789,425 is directed to the "roof-shooter" configuration. However, although this patent employs anisotropic etching of the substrate to form ink feed channels, it fails to address the issue of how to supply the volume of ink required at higher frequencies of operation. Further, there is no teaching of control of geometry, pen speed, or specific hydraulic damping control. Specifically, this reference fails to address the issue of precisely matching the fluid impedance of every functional nozzle so that they all behave the same.

A need remains to provide a process for fabricating ink fill slots in thermal ink-jet print-heads in which the fluid impedance of every functional nozzle is precisely matched.

DISCLOSURE OF INVENTION

It is an advantage of the present invention to provide ink fill slots with a minimum of fabrication steps in a batch processing mode.

It is another advantage of the invention to provide precise control of geometry and alignment of the ink fill slots to permit precise matching of fluid impedances of each nozzle.

It is a still further advantage of the invention to provide ink fill slots appropriately configured to provide the requisite volume of ink at increasingly higher frequency of operation, up to at least 14 kHz.

In accordance with the invention, an ink fill slot can be precisely manufactured in a substrate utilizing photolithographic techniques with chemical etching, plasma etching, or a combination thereof. These methods may be used in conjunction with laser machining, mechanical abrasion, electromechanical machining, or conventional etch to remove additional substrate material in desired areas.

The improved ink-jet printhead of the invention includes a plurality of ink-propelling thermal elements, each ink-propelling element disposed in a separate drop ejection chamber defined by three barrier walls and a fourth side open to a reservoir of ink common to at least some of the elements, and a plurality of nozzles comprising orifices disposed in a cover plate in close proximity to the elements, each orifice operatively associated with an element for ejecting a quantity of ink normal to the plane defined by each element and through the orifices toward a print medium in pre-defined sequences to form alphanumeric characters and graphics thereon. Ink is supplied to the thermal element from an ink fill slot by means of an ink feed channel. Each drop ejection chamber may be provided with a pair of opposed projections formed in walls in the ink feed channel and separated by a width to cause a constriction between the plenum and the channel, and each drop ejection chamber may be further provided with lead-in lobes disposed between the projections and separating one ink feed channel from a neighboring ink feed channel. The improvement comprises forming the ink fill slot and the drop ejection chamber and associated ink feed channel on one substrate, in which the ink fill slot is partially formed by anisotropic etching of the substrate, employing chemical and/or plasma etching. The dimensions of the ink fill slot relative to the ink feed channel may be precisely controlled to aid in fluid tuning of the pen.

The ink fill slot position can be controlled to within about 20 μm of the hydraulic limiting orifice (the area between the lead-in lobes) and can be modulated in depth as the slot extends to minimize air bubble trapping.

The frequency of operation of thermal ink-jet pens is dependent upon the shelf or distance the ink needs to travel from the ink fill slot to the firing chamber, among other things. At higher frequencies, this distance, or shelf, must also be fairly tightly controlled. Through photochemical micromachining, this distance can be more tightly controlled and placed closer to the firing chamber. Etching can be from the frontside, backside, or both. A combination of etch processes can allow a range of profiles of the ink fill slot and shelf. This process can be used instead of, or in conjunction with, conventional "mechanical" slotting procedures to enhance performance or allow batch processing.

Figure 1:
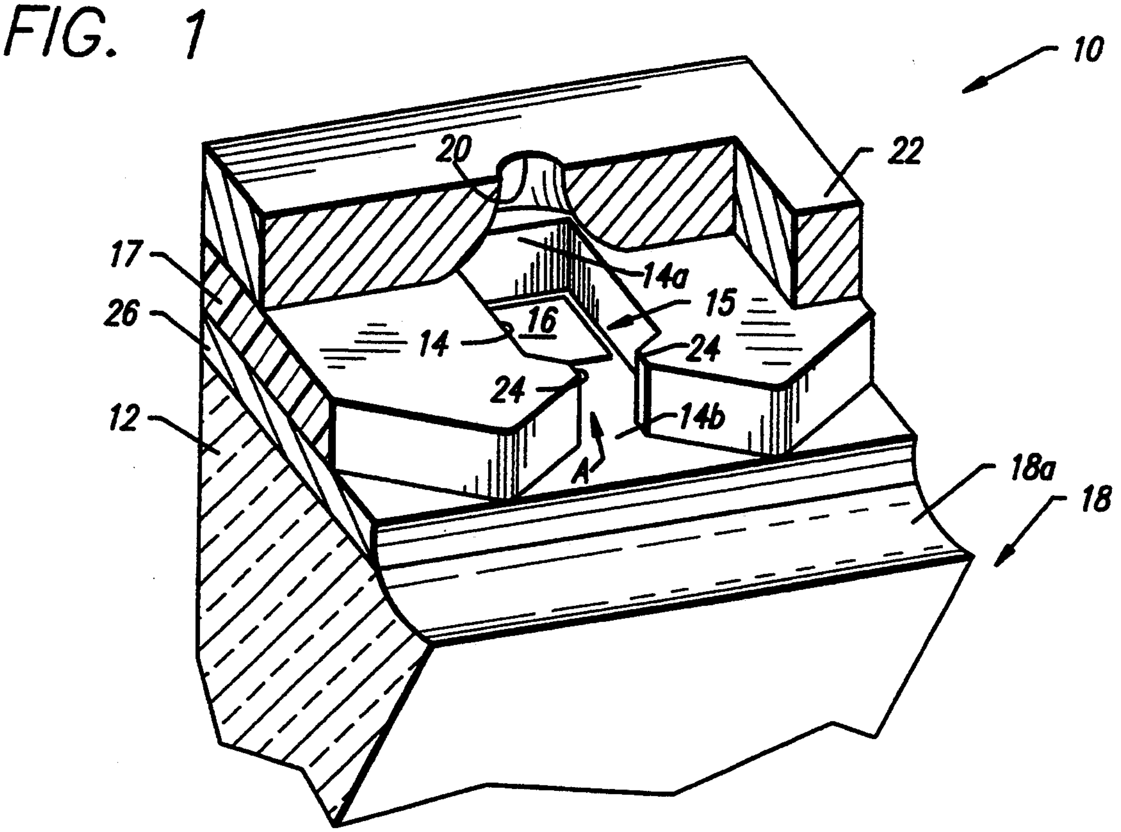
FIG. 1 is a perspective view of a resistor situated in a firing chamber formed from a barrier layer, an ink feed channel fluidically communicating with the firing chamber, and an ink fill slot for supplying ink to the ink feed channel, in accordance with the invention.
Figure 2A:
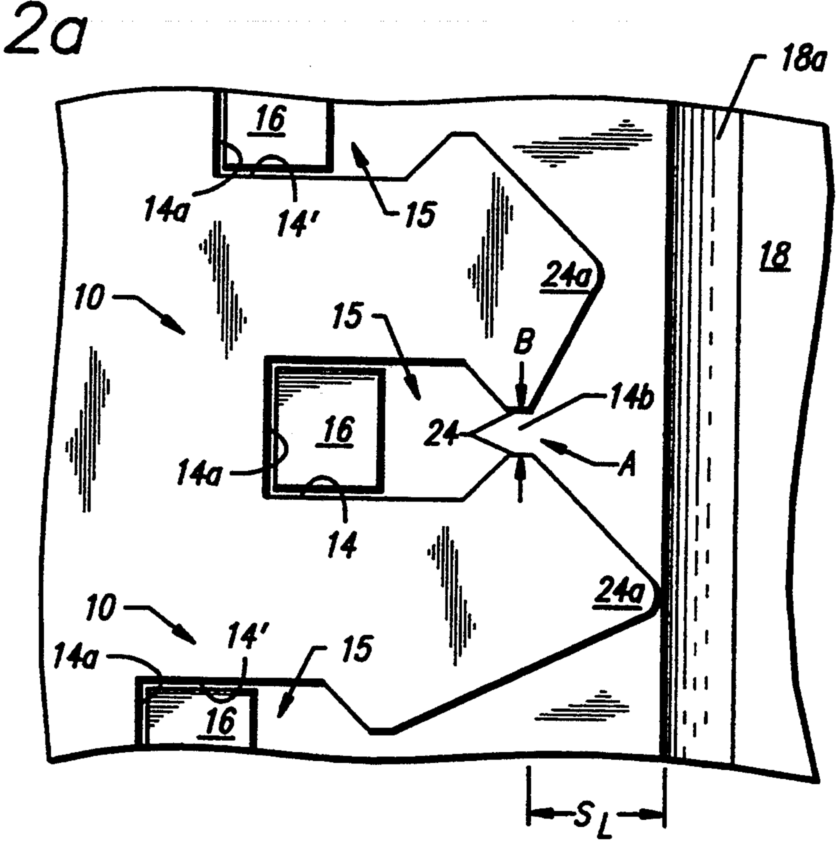
Figure 3:
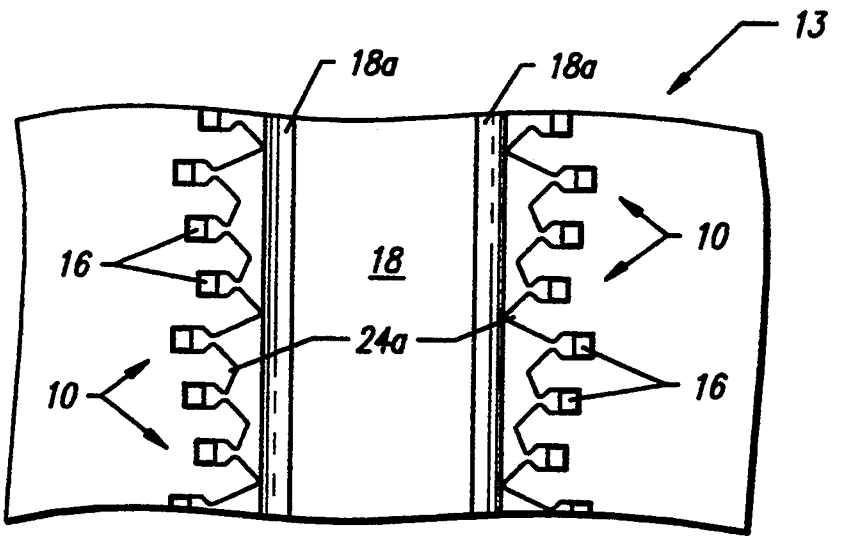
Figure 5B:
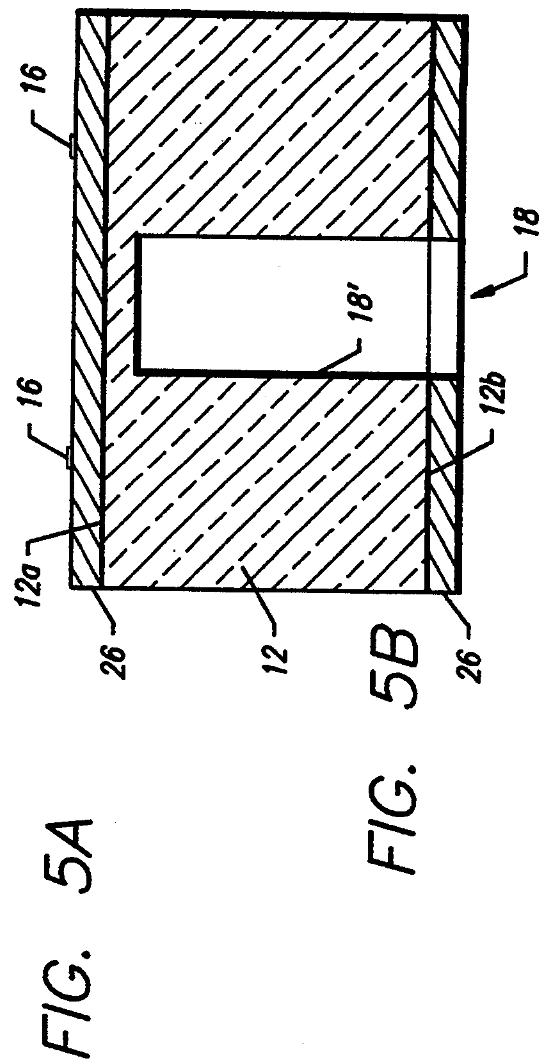
Figure 5D:
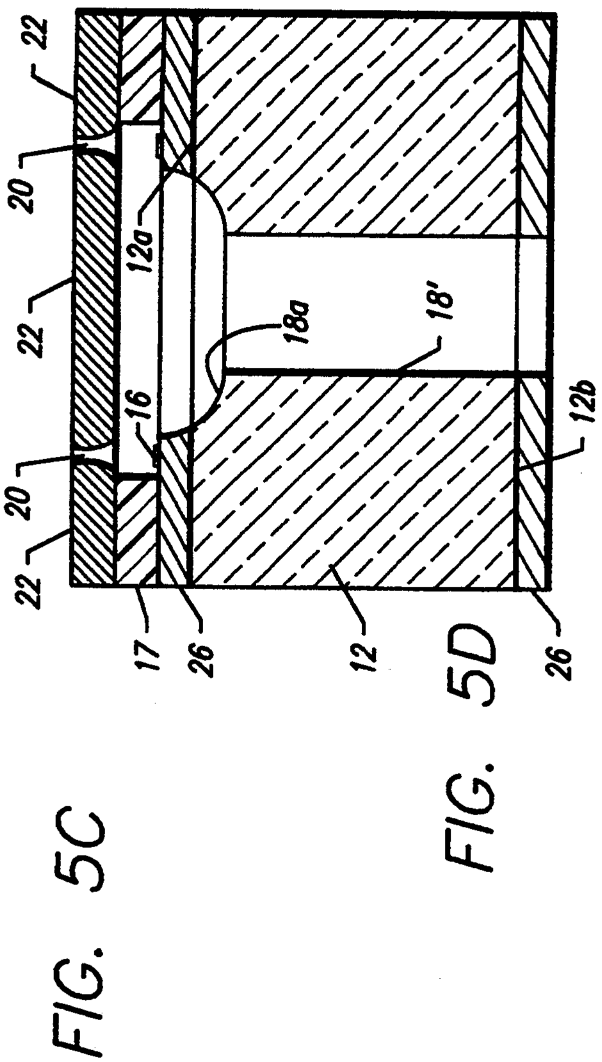
Figure 5A:
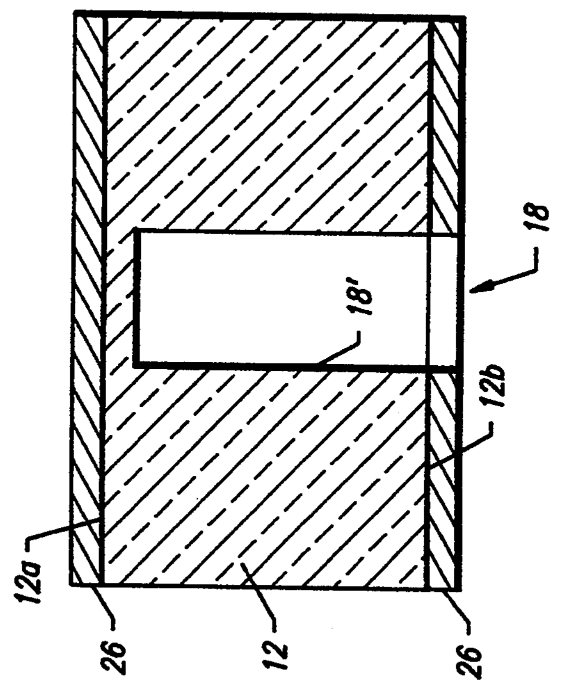
Figure 5C:
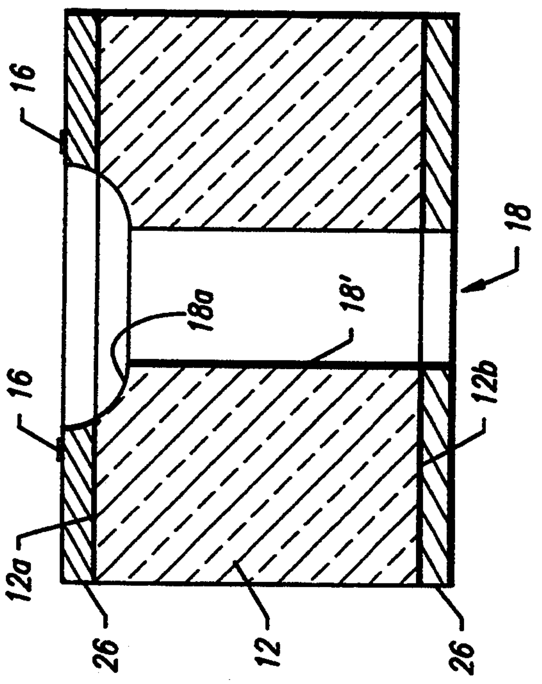
Figure 6A:
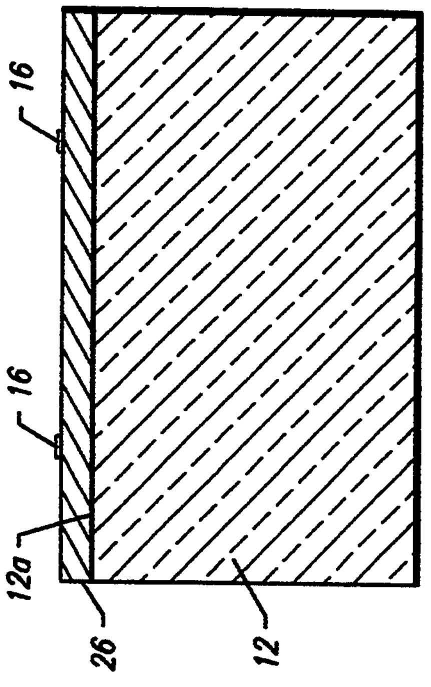
Figure 6B:
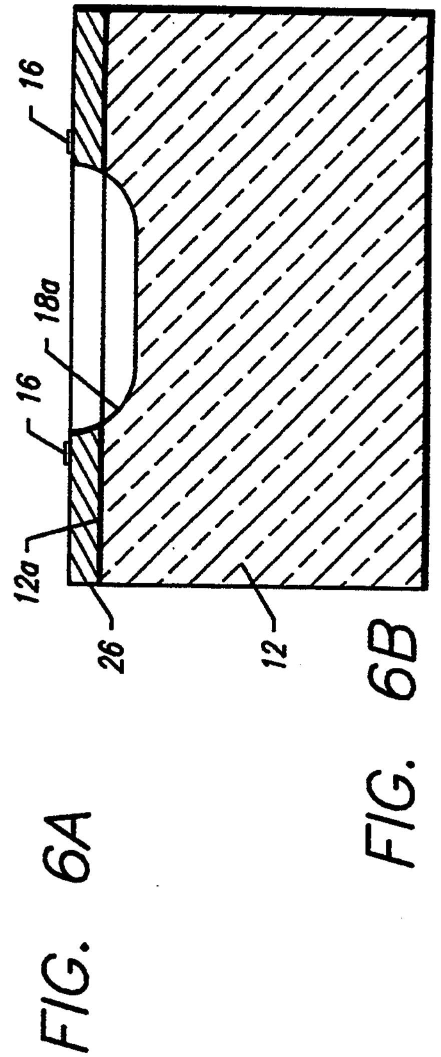
Figure 6C:
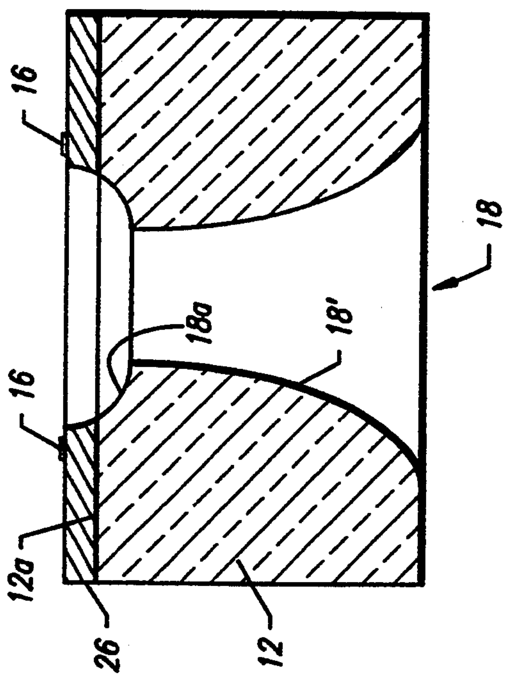
Figure 6D:
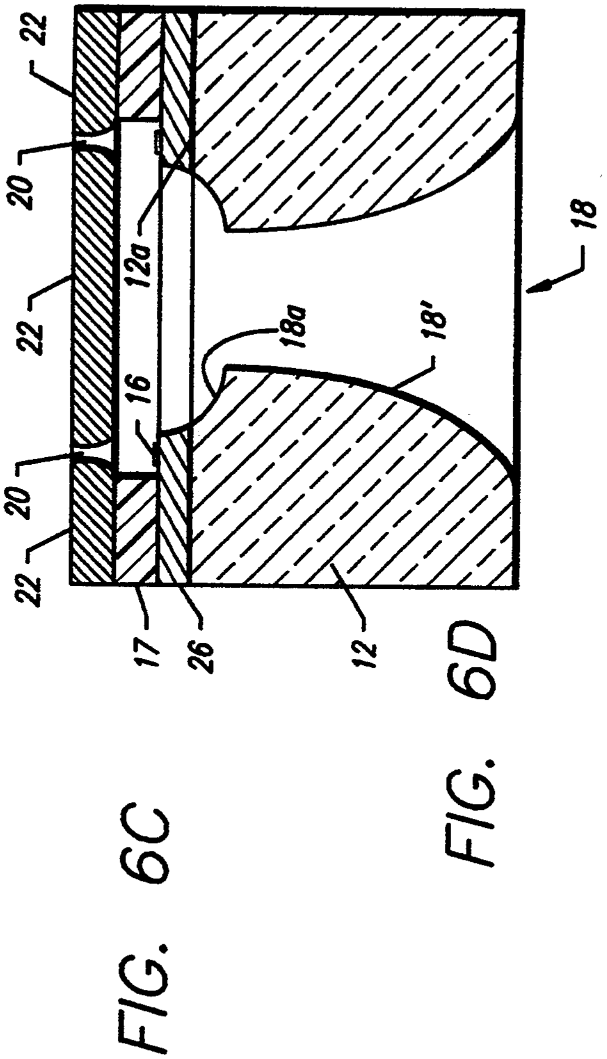
Figure 7:
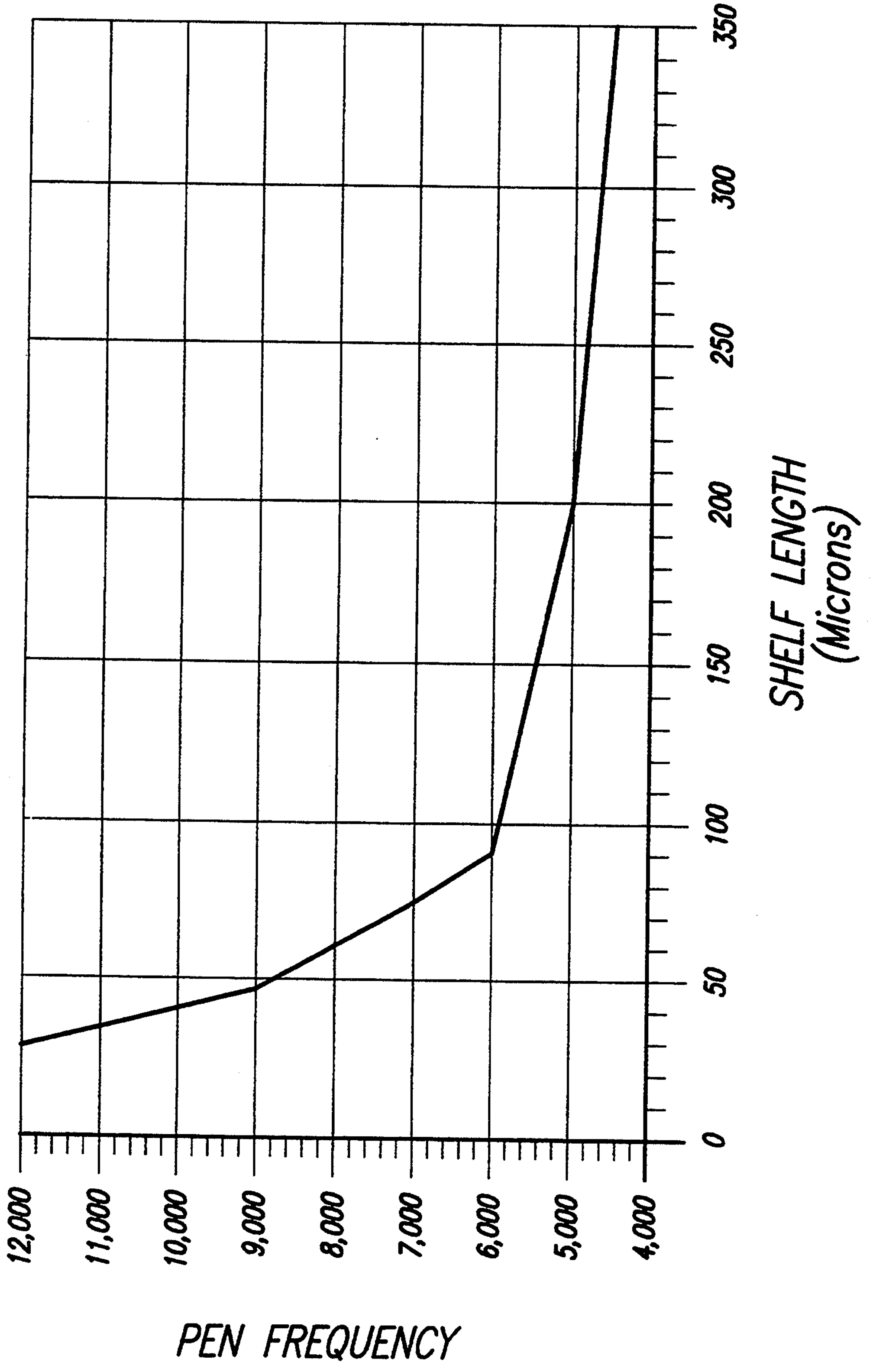

FIG. *2a* is a top plan view of the configuration depicted in FIG. 1 and including adjacent resistors and ink feed channels, in which the shelf length is a constant dimension as measured from the entrance to the ink feed channel;

FIG. *2b* is a view similar to that of FIG. *2a*, but depicting an equalized shelf length that follows the contours of the barrier layer;

FIG. 3 is a top plan view of a portion of a printhead, showing one embodiment of a plurality of the configurations depicted in FIG. 2A;

FIGS. 4A–4D are cross-sectional view of the resistor configuration of FIG. 3, showing the results of anisotropic etching of a <100> oriented silicon substrate;

FIG. 5A–5D are a similar views as FIGS. 4A–4D, but with a <110> oriented silicon substrate;

FIG. 6A–6D are cross-sectional view equivalent to FIGS. 4A–4D or 5A–5D in which the ink-feed slot is produced by abrasive or laser micromachining; and FIG. 7, on coordinates of pen frequency in Hertz and shelf length in micrometers, is a plot of the dependence of pen frequency as a function of shelf length for a specific drop volume case.

BEST MODES FOR CARRYING OUT THE INVENTION

Referring now to the drawings where like numerals of reference denote like elements throughout, FIG. 1 depicts a printing or drop ejecting element 10, formed on a substrate 12. FIGS. *2a* and *2b* depict three adjacent printing elements 10, while FIG. 3 depicts a portion of a printhead 13 comprising a plurality of such firing elements and shows a common ink fill slot 18 providing a supply of ink thereto. Although FIG. 3 depicts one common configuration of a plurality of firing elements, namely, two parallel rows of the firing elements 10 about a common ink fill slot 18, other configurations employed in thermal ink-jet printing, such as approximately circular and single row, may also be formed in the practice of the invention.

Each firing element 10 comprises an ink feed channel 14, with a resistor 16 situated at one end 14*a* thereof. The ink feed channel 14 and drop ejection chamber 15 encompassing the resistor 16 on three sides are formed in a layer 17 which comprises a photopolymerizable material which is appropriately masked and etched/developed to form the desired patterned opening.

Ink (not shown) is introduced at the opposite end 14*b* of the ink feed channel 14, as indicated by arrow "A", from an ink fill slot, indicated generally at 18. Associated with the resistor 16 is a nozzle, or convergent bore, 20, located near the resistor in a nozzle plate 22. Droplets of ink are ejected through the nozzle (e.g., normal to the plane of the resistor 16) upon heating of a quantity of ink by the resistor.

A pair of opposed projections 24 at the entrance to the ink feed channel 14 provide a localized constriction, as indicated by the arrow "B". The purpose of the localized constriction, which is related to improve the damping of fluid motion of the ink, is more specifically described in U.S. Pat. No. 4,882,595, and forms no part of this invention.

Each such printing element 10 comprises the various features set forth above. Each resistor 16 is seen to be set in a drop ejection chamber 15 defined by three barrier walls and a fourth side open to the ink fill slot 18 of ink common to at least some of the elements 10, with a plurality of nozzles 20 comprising orifices disposed in a cover plate 22 near the resistors 16. Each orifice 20 is thus seen to be operatively associated with an resistor 16 for ejecting a quantity of ink normal to the plane defined by that resistor and through the orifices toward a print medium (not shown) in defined patterns to form alphanumeric characters and graphics thereon.

Ink is supplied to each element 10 from the ink fill slot 18 by means of an ink feed channel 14. Each firing element 10 is provided with a pair of opposed projections 24 formed in walls in the ink feed channel 14 and separated by a width "B" to cause a constriction between the ink fill slot 18 and the channel. Each firing element 10 may be provided with lead-in lobes 24*a* disposed between the projections 24 and separating one ink feed channel 14 from a neighboring ink feed channel 14'.

Figure 2B:
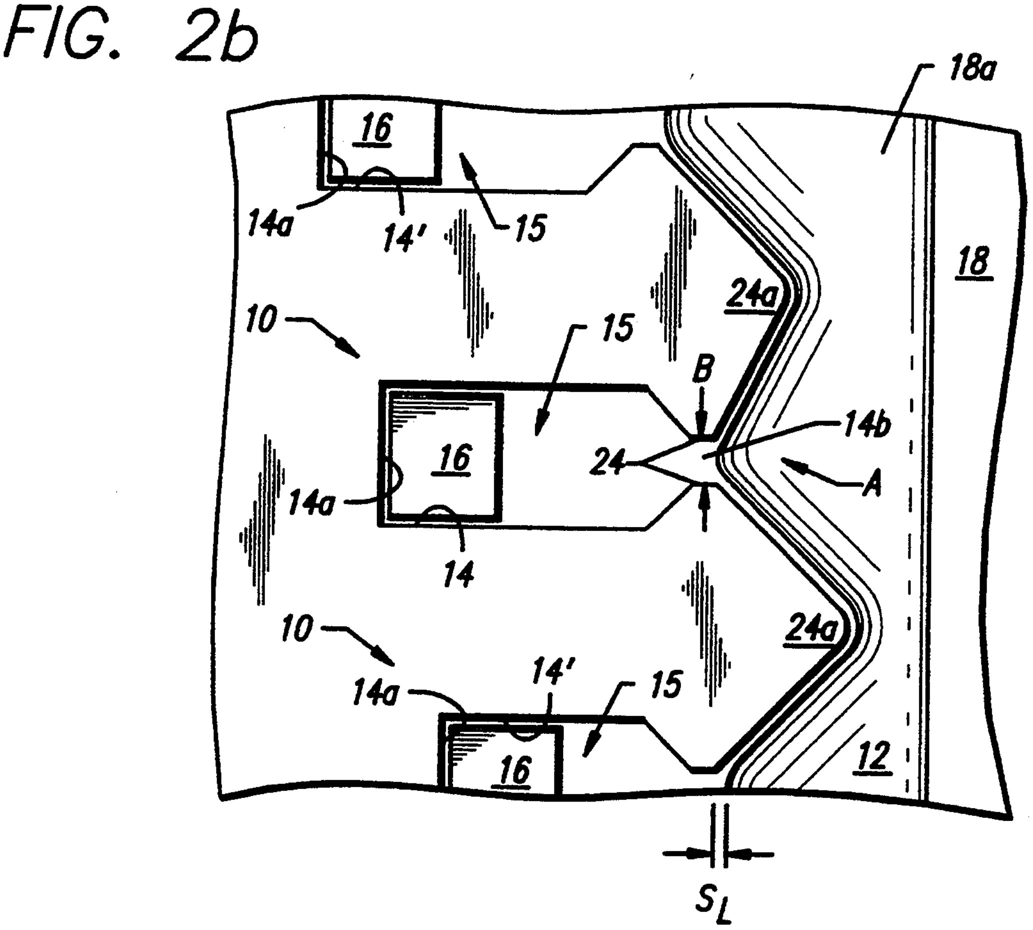

The improvement comprises a precision means of forming the ink fill slot 18 and associated ink feed channel 14 on one substrate 12. In the process of the invention, the ink fill slot 18 is extended to the pair of lead-in lobes 24*a* of each firing chamber, either at a constant distance from the entrance to the ink feed channel 14, as shown in FIG. 2A, or at an equalized distance from the contour formed by the barrier layer 17, as shown in FIG. 2B. The ink fill slot 18 is extended by means of extension 18*a* toward the lead-in lobes 24*a*, using precise etching, described in greater detail below, to controllably align the ink fill slot relative to the entrance to the ink feed channel 14, indicated at "A".

In FIG. 2A, the extended portion 18*a* of the ink fill slot 18 terminates at a constant distance from the centerline of the ink fill slot, very close to the lead-in lobes 24*a*. Use of precise etching, described below, permits a shorter shelf length, $S_L$, to be formed; this shelf length is shorter than that of a presently commercially available pen used in Hewlett-Packard's DeskJet® printer, which extends to the edge of the ink fill slot 18. The shorter shelf length permits firing at higher frequencies than presently commercially available pens. While the fluid impedance of the pen imparted to the ink is reduced compared to that in the commercially available pens, thereby resulting in improved performance, it is not substantially constant from one resistor heater 16 to the next.

In FIG. 2B, the extended portion 18*a* of the ink fill slot 18 follows the contour of the barrier wall 17 defining the lead-in lobes 24*a*, providing an equalized shelf length $S_L$. This equalized shelf length provides a substantially constant fluid impedance to the ink in the pen, which results in improved pen performance.

In accordance with the invention, the extended portion 18a of the ink fill slot 18 is precisely manufactured in a substrate 12 utilizing photolithographic techniques with chemical etching, plasma etching, or a combination thereof. These methods may be used in conjunction with laser micromachining, mechanical abrasion, or electromechanical machining to remove additional substrate material in desired areas.

Figure 4A:
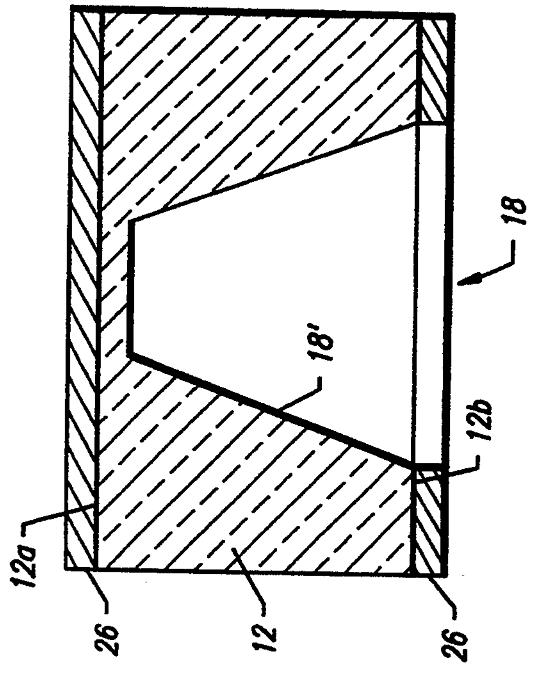
Figure 4B:
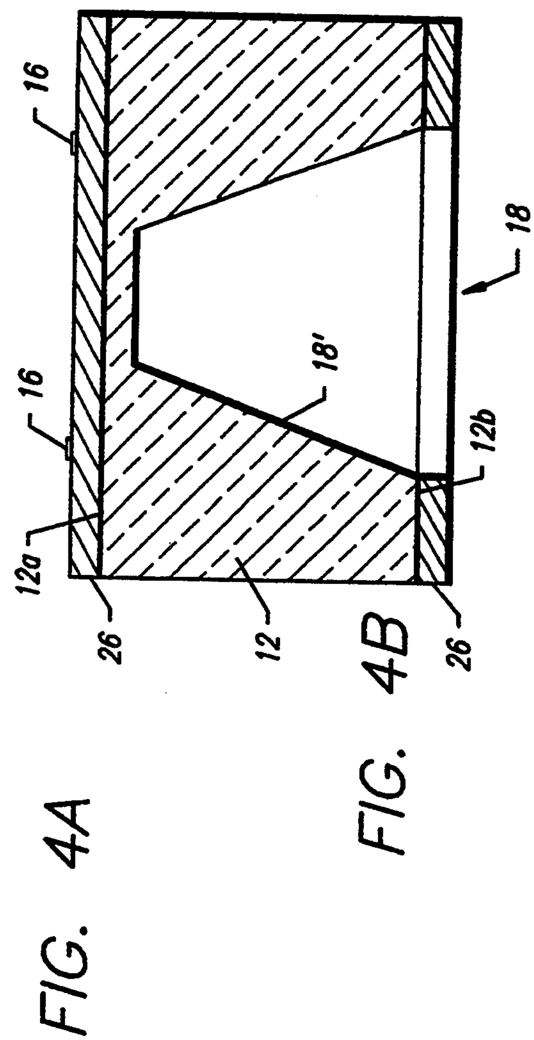
Figure 4C:
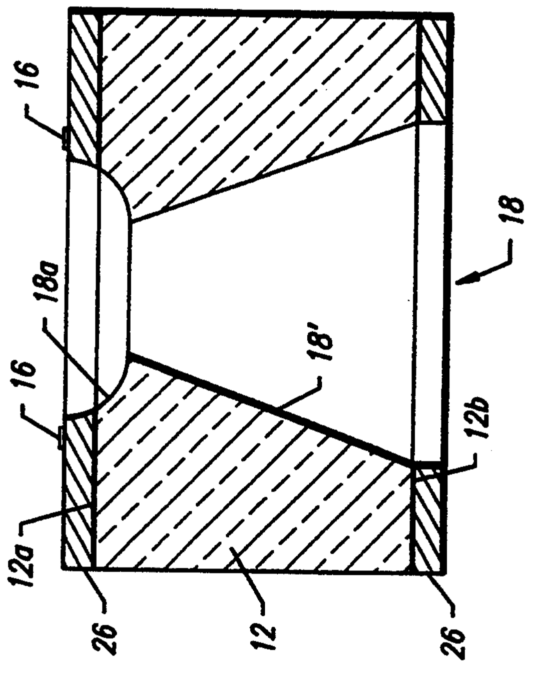

Representative substrates for the fabrication of ink fill slots 18 in accordance with the invention comprise single crystal silicon wafers, commonly used in the microelectronics industry. Silicon wafers with <100> or <110> crystal orientations are preferred. Three methods of ink fill slot fabrication consistent with this invention are detailed below. Typical resultant structures are shown in FIGS. 4C, 5C, and 6C.

In one embodiment, depicted in FIGS. 4A–D, the following steps are performed:

1. Mask the silicon wafer 12 to protect areas not to be etched. Thermally grown oxide 26 is a representative etch mask for silicon.
2. Photo-define openings in the etch mask using conventional microelectronics photolithographic procedures to expose the silicon on the secondary (back) surface to be removed in the desired ink flow channel areas.
3. Etch part way into the silicon substrate from the back surface through the exposed areas of the openings to form the ink fill slots 18, using anisotropic etchants to provide the desired geometric characteristics of the ink flow channels.
4. Etch into the front surface (a) to connect with the ink fill slots 18 and (b) to extend the ink fill slots to the entrances of the ink feed channels formed in the barrier layer 17, forming portion 18a. The barrier layer 17 and defined drop ejection chamber 15 and ink feed channel 14, along with resistor heater 16 and associated electrical traces, are formed in separate steps prior to this step. The etching in this step may be done using any or all of an isotropic etchant, such as dry (plasma) etching.

Figure 4D:
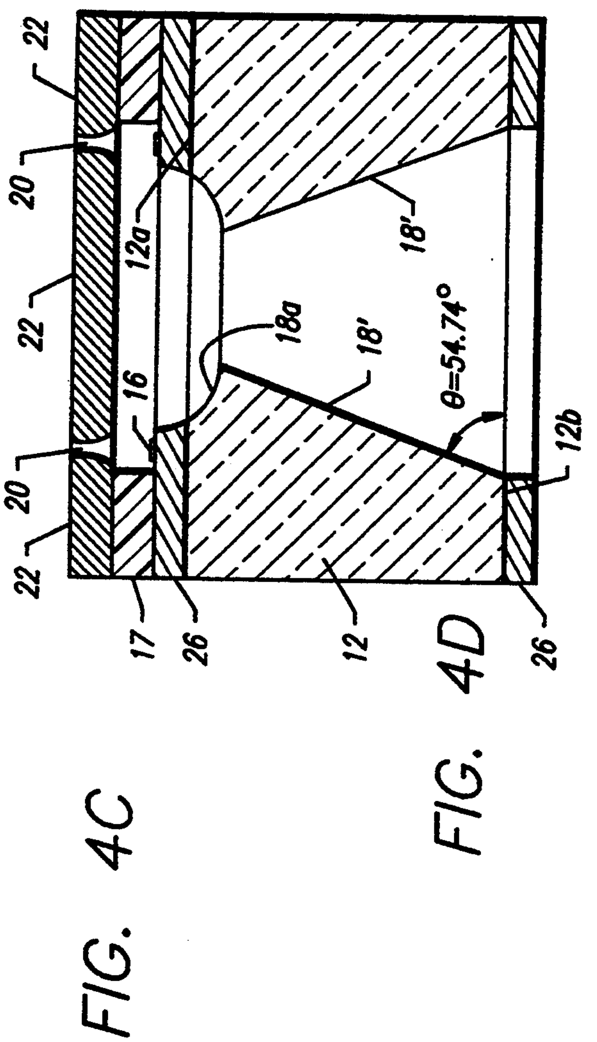

FIG. 4D is a cross-sectional view of a final structure in which ink is fed from the bottom of the substrate 12. In the process depicted in FIGS. 4A–D, <100> oriented silicon is employed as the substrate 12. An oxide film 26, preferably silicon dioxide, is formed on both surfaces 12a, 12b of the substrate and is used to define the ink fill slot 18 to be etched. Alternatively, a silicon nitride film or other masking layer could be used, as detailed in the prior art.

The dielectric 26 on the secondary surface 12b is patterned prior to formation of the ink fill slot 18.

The ink fill slot 18 comprises two portions. The first portion, 18′, is formed by anisotropic etching. Since the anisotropic etching is in <100> silicon, the angle formed is 54.74°, as is well-known. An aqueous solution of KOH, in a ratio of KOH:$H_2O$ of 2:1, heated to about 85° C. is used for the anisotropic etching. This etchant etches <100> silicon at a rate of about 1.6 μm/minute. As is well-known, the etching action is greatly reduced at a point where the <111>planes intersect, and the <100> bottom surface no longer exists.

The anisotropic etching is stopped part way through the silicon wafer 12, as shown in FIG. 4A. Next, heater resistors 16 (and electrical traces, or conductors, associated therewith, not shown) are formed on the front surface 12a of the wafer, as shown in FIG. 4B. The process, which is well-known, comprises forming appropriate layers and patterning them.

The second portion, 18a, of the ink fill slot 18 is formed by a combination of isotropic and anisotropic etching, either by wet or dry processes, from the primary surface 12′. This process etches through the dielectric layer 26 on the primary surface 12a and into the silicon wafer 12 to connect with the previously-etched ink fill slot portion 18′. The resulting structure is shown in FIG. 4C.

Dry etching in a plasma system may be used to define the second portion 18a. $CF_4$ may be used, but other plasma etchants are also available for faster etching of the passivation while still protecting the silicon surface from overetch.

It is this latter etching step that brings the ink fill slot 18 very close to the ink feed channel 14. The proximity of the ink fill slot 18 to the ink feed channel 14 permits the printhead to be very responsive to demands for ink required at high drop ejection frequencies. Suitable masking is used to form the second portion 18a; this masking may be configured to permit obtaining either the constant shelf length structure depicted in FIG. 2A or the equalized shelf length structure depicted in FIG. 2B.

The structure is completed, as depicted in FIG. 4D, by the formation of the barrier layer 17 and the orifice plate 22 with nozzles 20 therein.

FIGS. 5A–D represent a similar cross-sectional view of a final structure in which ink is fed from the bottom of the substrate 12, which in this case is <110> oriented. Here, anisotropic etching may be used to etch part way or all the way through the substrate 10, using the same etchant as for <100>. The only difference in the process of this embodiment from that depicted in FIGS. 4A–D is the use of silicon of a different crystallographic orientation.

In another embodiment, shown in FIGS. 6A–D, the wafer is processed by known thermal ink-jet processes on the primary surface to form resistors 16 on the surface of the passivating layer 26. A suitable photodefined masking layer (not shown) is then applied and imaged, exposing the area to be precision etched. Examples of such masking layers include DuPont's VACREL and positive or negative photoresists, such as Hoechst AZ4906 or OCG SC900, respectively. In this case, only the primary surface, 12a, needs to be protected by the in-sulating dielectric layer 26.

Etching is done by well-documented dry processes utilizing $CF_4+O_2$, $SF_6$, or a mixture of fluorocarbon and noble gases to form portion 18a. The etch profile can be controlled by varying operating pressure and/or etcher configuration from reactive ion etching regimes (about 50 to 150 millitorr pressures and about 400 to 1,000 volts effective bias) anisotropic etching to high pressure planar etch regions (about 340 to 700 millitorr pressure and 0 to about 100 volts effective bias) isotropic etching or some subtle and beneficial combination of processes. The main part 18′ of the ink feed slot 18 is then formed by micromachining, such as mechanical abrasion, e.g., sandblasting, or laser ablation, or electromechanical machining from the secondary surface 12b.

The barrier layer 17 is generally formed prior to the final formation of the main part 18′, for reasons related to wafer handling (making the wafer stronger) and parts flow (avoiding returning the wafer to the clean room for processing).

The frequency limit of a thermal ink-jet pen is limited by resistance in the flow of ink to the nozzle. Some resistance in ink flow is necessary to damp meniscus oscillation. However, too much resistance limits the upper frequency that a pen can operate. Ink flow resistance (impedance) is intentionally controlled by a gap adjacent the resistor 16 with a well-defined length and width. This gap is the ink feed channel 14, and its geometry is described elsewhere; see, e.g., U.S. Pat. No. 4,882,595, issued to K. E. Trueba et al and assigned to the same assignee as the present application. The distance of the resistor 16 from the ink fill slot 18 varies with the firing patterns of the printhead.

An additional component to the impedance is the entrance to the ink feed channel 14, shown on the drawings at A. The entrance comprises a region between the orifice plate 22 and the substrate 12 and its height is essentially a function of the thickness of the barrier material 17. This region has high impedance, since its height is small, and is additive to the well-controlled intentional impedance of the gap adjacent the resistor.

The distance from the ink fill slot 18 to the entrance to the ink feed channel 14 is designated the shelf $S_L$. The effect of the length of the shelf on pen frequency can be seen in FIG. 7: as the shelf increases in length, the nozzle frequency decreases. The substrate 12 is etchedin this shelf region to form extension 18*a* of the ink fill slot 18, which effectively reduces the shelf length and increases the cross-sectional area of the entrance to the ink feed channel 14. As a consequence, the fluid impedance is reduced; both of the embodiments described above are so treated. In this manner, all nozzles have a more uniform frequency response. The advantage of the process of the invention is that the entire pen can now operate at a uniform higher frequency. In the past, each nozzle 20 had a different impedance as a function of its shelf length. With this variable eliminated, all nozzles have substantially the same impedance, thus tuning is simplified and when one nozzle is optimized, all nozzles are optimized. Previously, the pen had to be tuned for worst case nozzles, that is, the gap had to be tightened so that the nozzles lowest in impedance (shortest shelf) were not under-damped. Therefore, nozzles with a larger shelf would have greater impedance and lower frequency response.

The curve shown in FIG. 7 has been derived from a pen ejecting droplets of about 130 pl volume. For this pen, a shelf length of about 10 to 50 μm is preferred for high operating frequency. For smaller drop volumes, the curves are flatter and faster.

As described earlier, FIGS. 2A and 2B depict the shelf length ($S_L$). In the former case, the shelf is at a constant location on the die and therefore the $S_L$ dimension as measured from the entrance to the ink feed channel 14 varies somewhat due to resistor stagger, while in the latter case, the shelf length is equalized, in that it follows the contours of the barrier layer 17.

INDUSTRIAL APPLICABILITY

The precision etch of the primary surface of the silicon substrate in combination with the anisotropically etch through the secondary surface provides improved ink flow characteristics and is expected to find use in thermal ink-jet printheads. The precision etch may be done by a variety of isotropic etching processes.

Thus, there has been disclosed the fabrication of ink fill slots in thermal ink-jet printheads utilizing photochemical micromachining. It will be apparent to those skilled in this art that various changes and modifications of an obvious nature may be made without departing from the spirit of the invention, and all such changes and modifications are considered to fall within the scope of the invention, as defined by the appended claims.

What is claimed is:

1. A method for fabricating ink fill slots for fluidically communicating with ink feed channels in thermal ink-jet printheads, comprising:

(a) providing a silicon substrate having a <100> or <110> crystallographic orientation and two opposed, substantially parallel major surfaces, defining a primary surface and a secondary surface;

(b) forming an insulating dielectric layer on both said surfaces;

(c) patterning said insulating dielectric layer on said secondary surface to expose underlying portions of said silicon substrate;

(d) etching part way through said silicon substrate with an anisotropic etchant at said exposed portions to thereby form a portion of said ink fill slot;

(e) forming and defining thin film resistor elements and conductive traces on said insulating dielectric layer on said primary surface;

(f) precisely etching from said primary surface to connect with said portion of said ink fill slot to thereby completely form said ink fill slot and to controllably extend the portion of said ink fill slot terminating at said primary surface toward said ink feed channels to cause a widening thereof; and (g) forming a barrier layer on the major surface of said dielectric material and defining openings therein to expose said resistor elements to define a drop ejection chamber and to provide said ink feed channels from each said resistor element to a terminus region, said terminus region fluidically communicating with said ink fill slot for introducing ink from a reservoir to said drop ejection chamber.

2. The method of claim 1 further comprising providing a nozzle plate with nozzle openings, each nozzle opening operatively associated with a resistor element to define an ink-propelling element.

3. The method of claim 2 wherein said terminus region is provided with a pair of opposed projections formed in walls in said layer defining said ink feed channel and separated by a width to cause a constriction in said ink feed channel.

4. The method of claim 3 wherein each ink-propelling element is provided with lead-in lobes disposed between said projections and separating one ink feed channel from a neighboring ink feed channel.

5. The method of claim 4 wherein said ink fill slot extends to said lead-in lobes.

6. The method of claim 5 wherein said extended portion of said ink fill slot terminates at a fixed location and constant distance from the centerline of said ink fill slot.

7. The method of claim 5 wherein said extended portion of said ink fill slot follows the contour of said barrier layer to provide an equalized shelf length.

8. The method of claim 1 wherein said etching through said primary surface to completely form said ink fill slot is done by at least one of anisotropic and isotropic etching.

9. The method of claim 8 wherein said isotropic etching is done by at least one of wet chemical etching and dry plasma etching.

10. A method for fabricating ink fill slots in thermal ink-jet printheads, comprising:

(a) providing a silicon substrate having a <100> or <110> crystallographic orientation and two opposed, substantially parallel major surfaces, defining a primary surface and a secondary surface;

(b) forming an insulating dielectric layer on said primary surface;

(c) forming and defining thin film resistor heaters and conductive traces on said insulating dielectric layer on said primary surface;

(d) providing a passivating dielectric layer covering said insulating dielectric layer and said thin film resistor heaters and traces;

(e) patterning said insulating dielectric layer on said primary surface to expose underlying portions of said silicon substrate;

(f) etching part way through said silicon substrate with an etchant at said exposed portions to thereby form a portion of said ink fill slot;

(g) forming a barrier layer on the major surface of said dielectric material and defining openings therein to expose said resistor elements to define a drop ejection chamber and to provide an ink feed channel from each said resistor element to a terminus region, said terminus region fluidically communicating with said ink fill slot for introducing ink from a reservoir to said drop ejection chamber, said ink fill slot controllably aligned relative to said terminus region; and (h) micromachining from said secondary surface to connect with said portion of said ink fill slot to thereby completely form said ink fill slot.

11. The method of claim 10 further comprising providing a nozzle plate with nozzle openings, each nozzle opening operatively associated with a resistor element to define an ink-propelling element.

12. The method of claim 11 wherein said terminus region is provided with a pair of opposed projections formed in walls in said layer defining said ink feed channel and separated by a width to cause a constriction in said ink feed channel.

13. The method of claim 12 wherein each ink propelling element is provided with lead-in lobes disposed between said projections and separating one ink feed channel from a neighboring ink feed channel.

14. The method of claim 13 wherein said ink fill slot extends to said lead-in lobes.

15. The method of claim 14 wherein said extended portion of said ink fill slot terminates at a fixed location and constant distance from the centerline of said ink fill slot.

16. The method of claim 14 wherein said extended portion of said ink fill slot follows the contour of said barrier layer to provide an equalized shelf length.

17. The method of claim 10 wherein said micromachining from said secondary surface is done by one of mechanical abrasion, laser ablation, or electromechanical machining.

18. The method of claim 17 wherein said mechanical abrasion is done by sand-blasting.

* * * * *